(12) United States Patent
Lee et al.

(10) Patent No.: US 9,525,406 B2
(45) Date of Patent: Dec. 20, 2016

(54) APPARATUS AND METHOD FOR COMPENSATING FOR DUTY SIGNALS

(71) Applicant: ELECTRONICS AND TELECOMMUNICATIONS RESEARCH INSTITUTE, Daejeon (KR)

(72) Inventors: Seung-Sik Lee, Daejeon (KR); Jae-Young Kim, Seoul (KR); Hong-Soon Nam, Daejeon (KR); Sang-Sung Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/829,508

(22) Filed: Aug. 18, 2015

(65) Prior Publication Data

US 2016/0164510 A1    Jun. 9, 2016

(30) Foreign Application Priority Data

Dec. 8, 2014 (KR) .................. 10-2014-0174751

(51) Int. Cl.
*H03K 3/017* (2006.01)
*H03K 5/156* (2006.01)

(52) U.S. Cl.
CPC .................... *H03K 5/1565* (2013.01)

(58) Field of Classification Search
CPC .................................... H03K 5/1565
See application file for complete search history.

(56) References Cited

U.S. PATENT DOCUMENTS

| 2001/0030562 A1 | 10/2001 | Kim et al. |
| 2004/0066861 A1 | 4/2004 | Song et al. |
| 2010/0104045 A1* | 4/2010 | Santraine ............... H03D 3/009 375/324 |
| 2010/0111230 A1 | 5/2010 | Lee et al. |
| 2013/0163696 A1 | 6/2013 | Son et al. |

FOREIGN PATENT DOCUMENTS

| KR | 10-2000-0055361 A | 9/2000 |
| KR | 10-2001-0095537 A | 11/2001 |
| KR | 10-2010-0050283 A | 5/2010 |
| KR | 10-2010-0087737 A | 8/2010 |
| WO | WO 2009/062130 A2 | 5/2009 |

\* cited by examiner

*Primary Examiner* — Daniel Puentes (57) ABSTRACT

An apparatus and method for compensating for duty signals are disclosed herein. The apparatus for compensating for duty signals includes a signal input unit, a signal control unit, a combined signal control unit, a determination unit, and a signal output unit. The signal input unit receives a first signal and a second signal. The signal control unit controls the timing of the first and second signals based on first and second control signals, and outputs a combined signal. The combined signal control unit outputs first and second logic operation signals. The determination unit generates the first and second control signals if the timing of the first signal does not match the timing of the second signal, outputs the generated first and second control signals, and applies a third control signal to the combined signal control unit. The signal output unit outputs the first and second signals.

12 Claims, 9 Drawing Sheets

APPARATUS AND METHOD FOR COMPENSATING FOR DUTY SIGNALS

CROSS-REFERENCE TO RELATED APPLICATION

This application claims the benefit of Korean Patent Application No. 10-2014-0174751, filed Dec. 8, 2014, which is hereby incorporated by reference herein in its entirety.

BACKGROUND

1. Technical Field

Embodiments of the present invention relate generally to an apparatus and method for compensating for duty signals and, more particularly, to a method of increasing the timing accuracy of a 25% duty signal required in the transmission stage or frequency synthesizer of a wireless communication system and to an apparatus and method for compensating for the timing error between an I signal and a Q signal.

2. Description of the Related Art

A Gilbert cell mixer used in a common wireless communication transmission stage and a frequency synthesizer requires a high power supply voltage in order to ensure sufficient linearity, and has poor timing characteristics attributable to a mismatch in a voltage current conversion circuit. Accordingly, the Gilbert cell mixer requires a technical change into a passive mixer. However, a passive mixer is problematic in terms of the degree of IF-RF separation, and requires the generation of a 25% duty signal within a local signal due to a crosstalk problem. The 25% duty signal has a very strong possibility that a timing mismatch may occur between an I signal and a Q signal.

Korean Patent Application Publication No. 10-2010-0050283 entitled "Receiver Capable of Compensating for Mismatch between I-signal and Q-signal and communication system thereof" (hereinafter referred to as conventional technology 1) relates to a receiver capable of compensating for a mismatch between an I signal and a Q signal and a communication system including the same. The receiver includes a frequency conversion unit configured to generate the in-phase signal and orthogonal phase signal of a multi-band frequency signal based on the multi-band frequency signal, and a mismatch compensation unit configured to estimate a mismatch between the in-phase signal and the orthogonal phase signal, appearing differently in each band of the multi-band frequency signal, with respect to each band, and to store at least one compensation value adapted to compensate for the estimated mismatch. The frequency conversion unit compensates for a mismatch between the in-phase signal and the orthogonal phase signal based on the at least one compensation value.

However, in conventional technology 1, a mismatch between the I and Q signals is estimated with respect to each band, at least one compensation value is required to compensate for the estimated mismatch, and only a mismatch between the phase differences of the I and Q signals is compensated for.

SUMMARY

At least some embodiments of the present invention are directed to the provision of an apparatus and method for compensating for duty signals, which measure and correct the mismatched timing between an I signal and Q signal having a 25% duty cycle.

At least some embodiments of the present invention are directed to the provision of an apparatus and method for compensating for the duty signals of an I signal and a Q signal, which match the timings of the start locations of signals with each other using a 50% duty signal and an I-Q signal.

Other objects of the present invention may be easily understood from the following description of embodiments.

In accordance with an aspect of the present invention, there is provided an apparatus for compensating for duty signals, including: a signal input unit configured to receive a first signal and a second signal; a signal control unit configured to control the timing of each of the first signal and the second signal based on each of a first control signal and a second control signal, and to output a combined signal in which the first signal and second signal whose timing has been controlled are combined; a combined signal control unit configured to output a first logic operation signal and a second logic operation signal by performing logic operation processing on a duty signal and the combined signal; a determination unit configured to determine whether the timing of the first signal matches the timing of the second signal, to generate the first control signal and the second control signal if the timing of the first signal does not match the timing of the second signal, to output the generated first control signal and second control signal, and to apply a third control signal, adapted to control the timing of the combined signal, to the combined signal control unit; and a signal output unit configured to output the first signal and the second signal whose timing has been matched by the signal control unit.

The first signal may be an I signal; and the second signal may be a Q signal.

The I and Q signals may have a 25% duty cycle.

The first control signal may be a signal adapted to control the timing of the first signal; and the second control signal may be a signal adapted to control the timing of the second signal.

The first logic operation signal may be an OR output signal generated by performing an OR operation of the combined signal and the duty signal; and the second logic operation signal may be an AND output signal generated by performing an AND operation of the combined signal and the duty signal.

The combined signal control unit may include: a signal combiner configured to generate the OR output signal; a comparator configured to generate the AND output signal; and a combined signal controller configured to control the timing of the combined signal based on the third control signal.

The determination unit may apply the third control signal to the combined signal controller until the AND output signal matches the OR output signal.

The combined signal may be configured such that the falling edge of the first signal matches the rising edge of the second signal.

In accordance with an aspect of the present invention, there is provided a method of compensating for a duty signal, including: determining, by a determination unit, whether the timing of a first signal input to a signal input unit matches the timing of a second signal input to the signal input unit; generating, by the determination unit, a control signal; outputting, by a signal control unit, a combined signal by combining the first signal and the second signal; outputting, by a combined signal control unit, a first logic operation signal and a second logic operation signal by performing logic operation processing on a duty signal and the combined signal; and outputting, by a signal output unit, the first signal and second signal whose timing has been matched.

The control signal may include: a first control signal adapted to control the timing of the first signal; a second control signal adapted to control the timing of the second signal; and a third control signal adapted to control the timing of the combined signal.

Determining whether the timing of the first signal matches the timing of the second signal may include determining whether the timing of the falling edge of the first signal matches the timing of the rising edge of the second signal.

The combined signal may be configured such that the falling edge of the first signal matches the rising edge of the second signal.

The controlled first signal and the controlled second signal may have a 25% duty cycle in which the timing of the falling edge of the first signal matches the timing of the rising edge of the second signal.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

The present invention may be subjected to various modifications and have various embodiments. Specific embodiments are illustrated in the drawings and described in detail below. However, this is not intended to limit the present invention to these specific embodiments, but is intended to encompass all modifications, equivalents and substitutions that fall within the technical spirit and scope of the present invention.

The terms used herein are used merely to describe embodiments, and are not intended to limit the inventive concept. A singular form may include a plural form, unless otherwise defined.

Embodiments of the present invention will be described in detail below with reference to the accompanying drawings.

Figure 1:
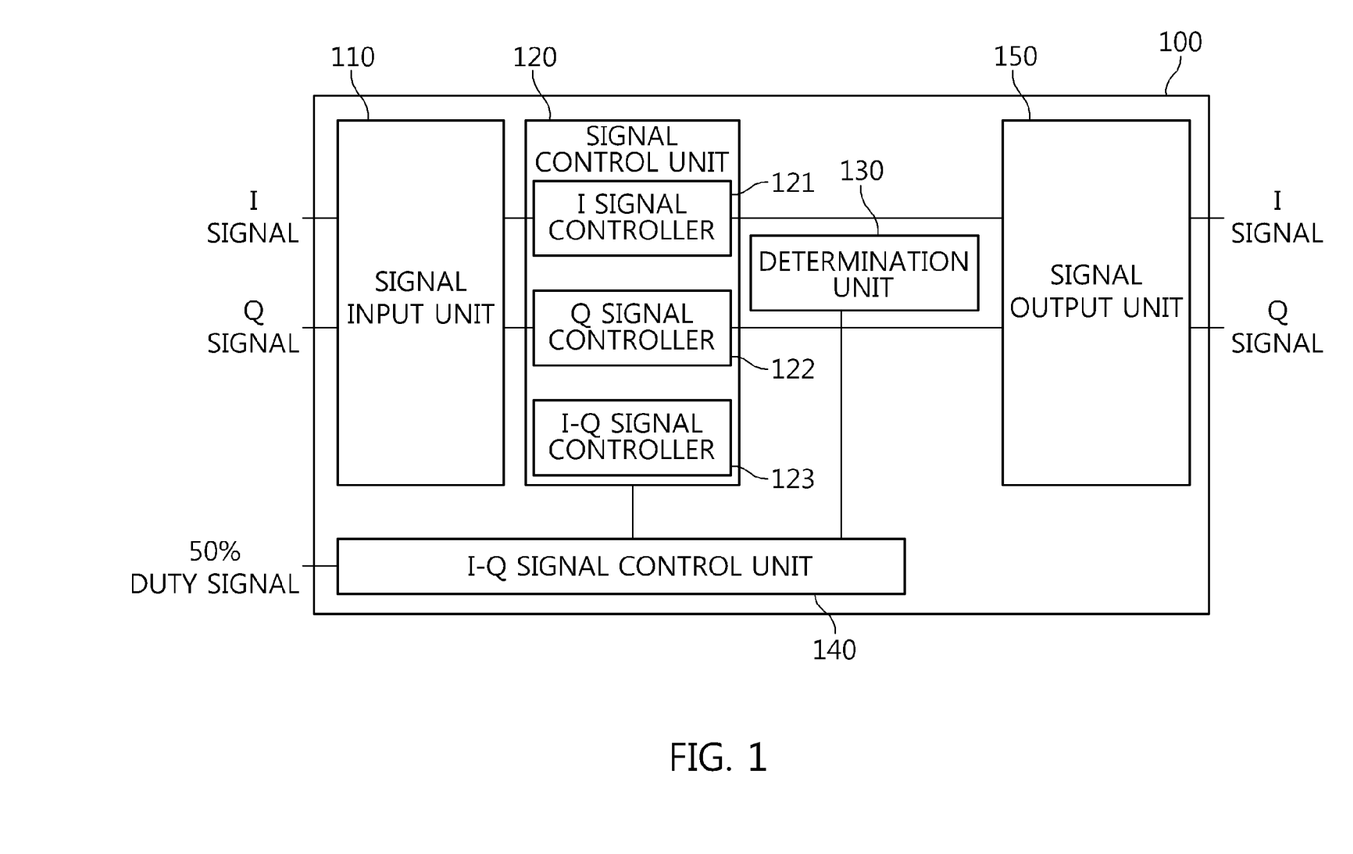
FIG. 1 is a diagram illustrating the functional configuration of an apparatus for compensating for the duty signals of an I signal and a Q signal according to an embodiment of the present invention.

FIG. 1 is a diagram illustrating the functional configuration of an apparatus for compensating for the duty signals of an I signal and a Q signal according to an embodiment of the present invention.

The apparatus 100 for compensating for the duty signals of an I signal and a Q signal according to the present embodiment includes a signal input unit 110, a signal control unit 120, a determination unit 130, an I-Q signal control unit 140, and a signal output unit 150.

The signal input unit 110 receives an I signal and a Q signal. The I signal may be a "first signal" described in the claims of the present invention, while the Q signal may be a "second signal" described in the claims of the present invention.

In this case, the received I and Q signals are duty signals having a 25% duty cycle. A method of generating the I and Q signals having a 25% duty cycle is described with reference to FIGS. 2 and 3.

The signal control unit 120 controls the timing of each of the I and Q signals that are input to the apparatus 100 for compensating for the duty signals of an I signal and a Q signal.

In a system using an I signal and a Q signal, data can be correctly used only when the timing of the I signal matches that of the Q signal.

Figure 6:
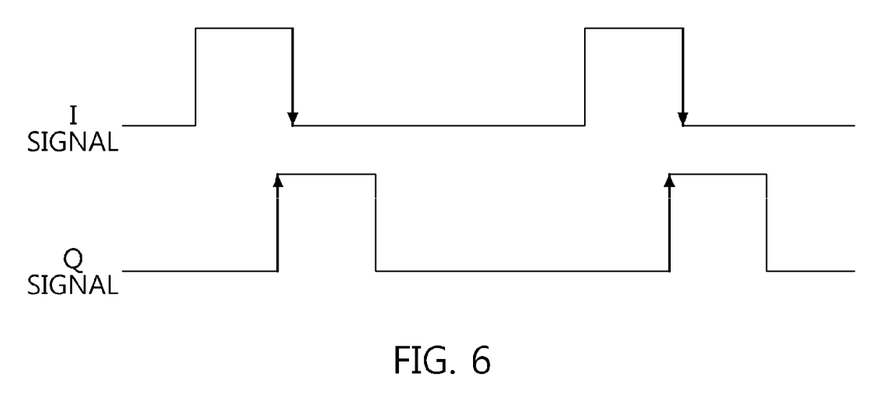
FIG. 6 is a diagram illustrating that the timing of an I signal has not been matched with that of a Q signal.
Figure 7:
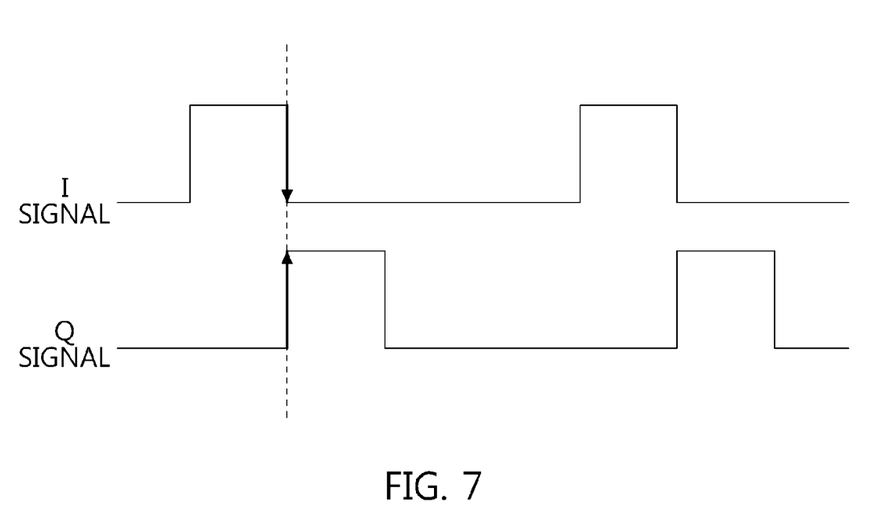
FIG. 7 is a diagram illustrating that the timing of an I signal has matched that of a Q signal.

That is, in the present embodiment, as shown in FIG. 7, only when the falling edge of an I signal matches the rising edge of a Q signal can transmission and reception data in wireless communication be correctly used. If the falling edge of an I signal does not match the rising edge of a Q signal as shown in FIG. 6, however, it is impossible to correctly use transmission and reception data.

Accordingly, in the present embodiment, the timing of each of an I signal and Q signal whose falling and rising edges do not match each other, as shown in FIG. 6, is controlled so that the falling edge of the I signal and the rising edge of the Q signal match each other, as shown in FIG. 7.

For this purpose, the signal control unit 120 functions to control the timing of each of the I and Q signals. Furthermore, the signal control unit 120 controls the timing of each of the I and Q signals, and generates the I-Q signal of FIG. 10 by combining the I and Q signals. The I-Q signal may be a combined signal described in the claims of the present invention.

The determination unit 130 determines whether the timing of the I signal input to the signal input unit 110 matches that of the Q signal input to the signal input unit 110. If the timing of the I signal does not match that of the Q signal, the determination unit 130 generates a control signal adapted to control (or correct) the timing of each of the I and Q signals, and controls the signal control unit 120 and the I-Q signal control unit 140 so that the timing of the I signal matches that of the Q signal (i.e., so that signals, such as those of FIG. 7, are generated).

Furthermore, the determination unit 130 compares a 50% duty signal, received from the I-Q signal control unit 140, with the OR output signal and AND output signal of the I-Q signal, and performs control so that the OR output signal matches the AND output signal. For this purpose, the determination unit 130 generates an I-Q control signal, and the I-Q signal control unit 140 performs control so that the OR output signal matches the AND output signal.

The I-Q signal control unit 140 generates the OR output signal, i.e., an OR combination of the 50% duty signal and the I-Q signal, and the AND output signal, i.e., an AND combination of the 50% duty signal and the I-Q signal, using the 50% duty signal and the I-Q signal received from the signal control unit 120. In this case, the OR output signal may be a first logic operation signal described in the claims of the present invention, and the AND output signal may be a second logic operation signal described in the claims of the present invention.

Furthermore, the I-Q signal control unit 140 controls the timing of the I-Q signal received from the signal control unit 120 using the I-Q control signal received from the determination unit 130.

The signal output unit 150 outputs I and Q signals, such as those of FIG. 7 (i.e., the falling edge of the I signal matches the rising edge of the Q signal) generated through such a process.

For this purpose, the signal output unit 150 may output the I and Q signals only when the falling edge of the I signal matches the rising edge of the Q signal, as shown in FIG. 7.

Figure 2:
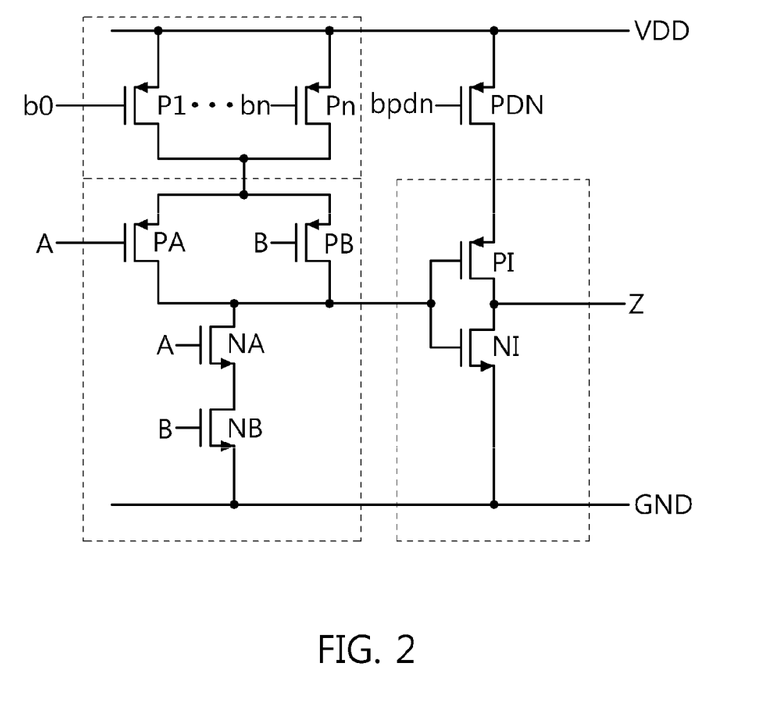
FIGS. 2 and 3 are diagrams illustrating a conventional technology for generating a 25% duty signal.
Figure 3:
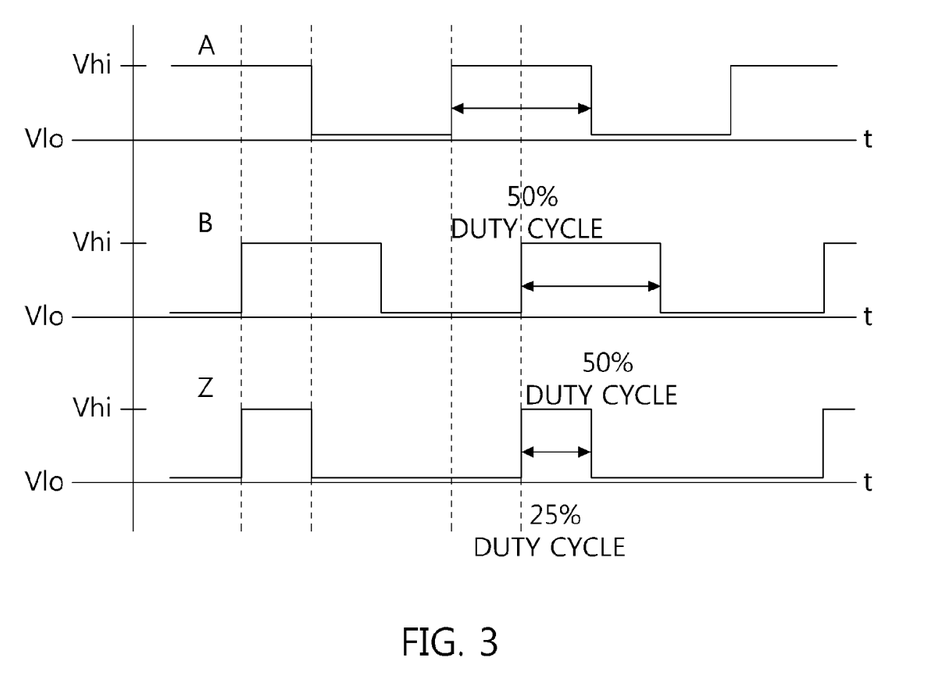

FIGS. 2 and 3 are diagrams illustrating a conventional technology for generating a 25% duty signal.

In this conventional technology, a 25% duty signal is generated using a signal A and a signal B having a 50% duty cycle.

That is, a signal Z becomes high only when the high time of the signal A matches the high time of the signal B. Accordingly, the rising edge of the signal B occurs at the mid time of the signal A, and thus the signal Z becomes a signal having a 25% duty cycle.

In an embodiment of the present invention, the I and Q signals input to the signal input unit 110 are generated using the above-described method.

Figure 4:
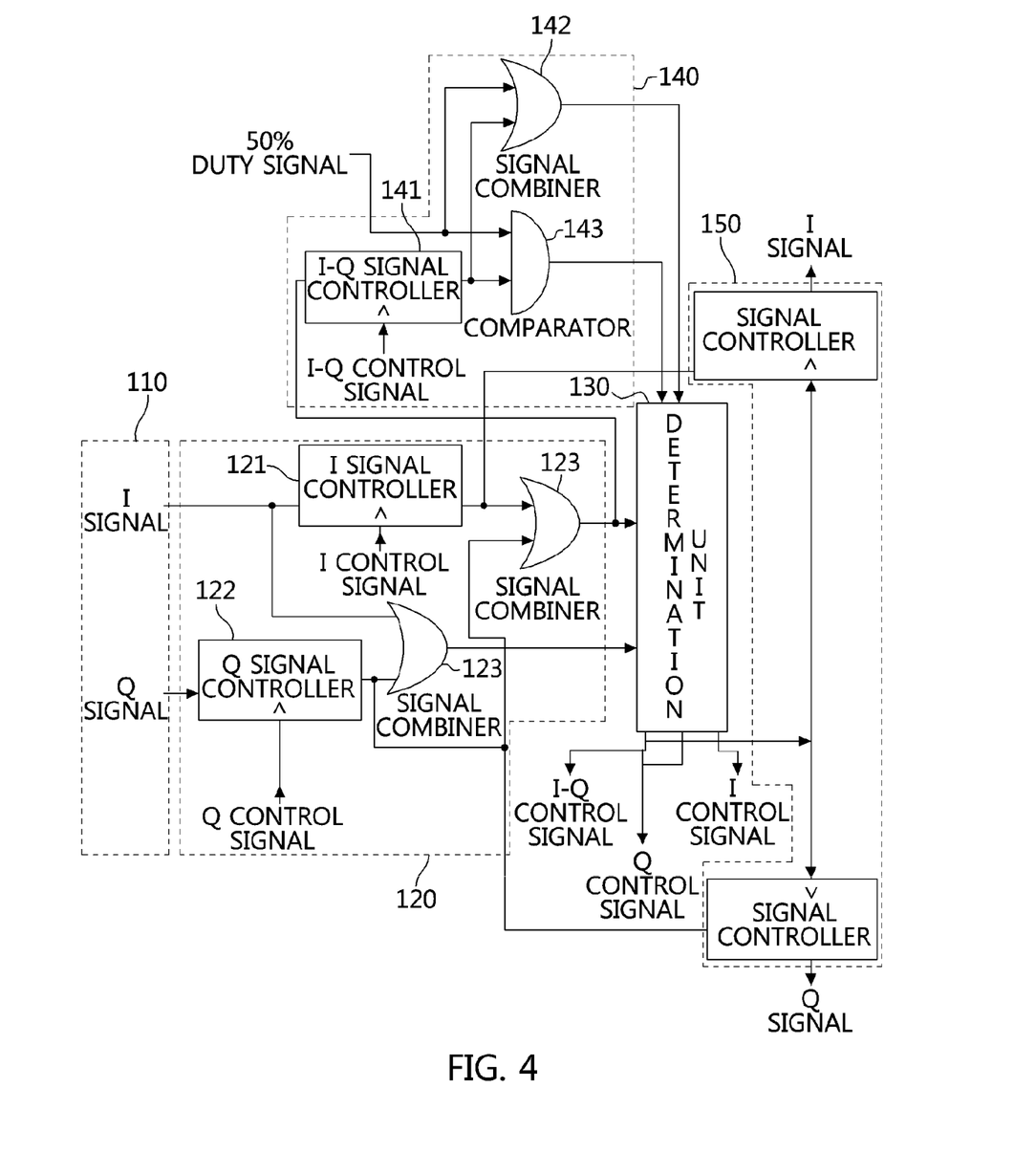
FIG. 4 is a diagram illustrating the configuration of the circuit of the apparatus for compensating for the duty signals of an I signal and a Q signal according to the embodiment of the present invention.

FIG. 4 is a diagram illustrating the configuration of the circuit of the apparatus for compensating for the duty signals of an I signal and a Q signal according to the embodiment of the present invention.

As described above with reference to FIG. 1, the apparatus 100 for compensating for the duty signals of an I signal and a Q signal according to the present embodiment includes the signal input unit 110, the signal control unit 120, the determination unit 130, the I-Q signal control unit 140, and the signal output unit 150.

The signal control unit 120 may include an I signal controller 121, a Q signal controller 122, and an I-Q signal generator 123.

Figure 9:
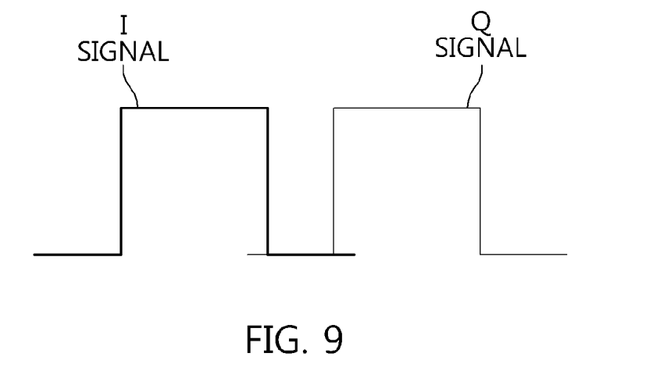
FIG. 9 is a diagram illustrating that the timing of the I signal is earlier than that of the Q signal.
Figure 10:
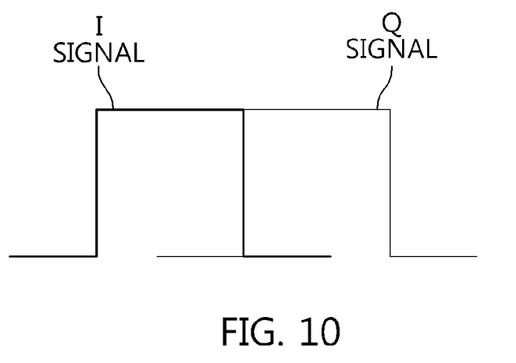
FIG. 10 is a diagram illustrating an I-Q signal generated according to an embodiment of the present invention.

The I signal controller 121 controls the timing of the I signal received from the signal input unit 110. That is, if the timing of the I signal is earlier than the timing of the Q signal as shown in FIG. 9, the I signal controller 121 delays the timing of the I signal using an inverter or a buffer so that the timing of the falling edge of the I signal matches that of the rising edge of the Q signal, as shown in FIG. 10.

Figure 8:
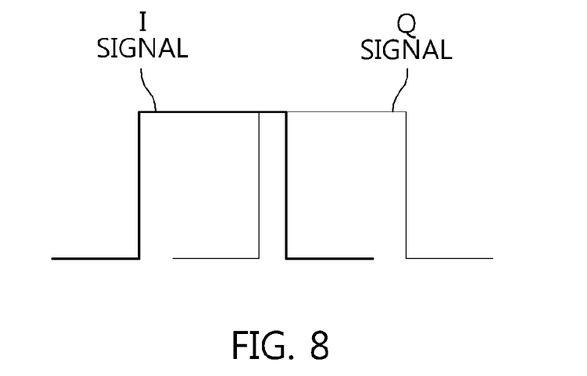
FIG. 8 is a diagram illustrating that an I signal and an Q signal are overlapped.

The Q signal controller 122 controls the timing of the Q signal received from the signal input unit 110. That is, if the I and Q signals are partially overlapped as shown in FIG. 8, the Q signal controller 122 delays the timing of the Q signal using an inverter or a buffer so that the timing of the falling edge of the I signal matches that of the rising edge of the Q signal, as shown in FIG. 10.

The I-Q signal generator 123 generates a I-Q signal by combining the I and Q signals whose timing has been controlled by the I signal controller 121 and the Q signal controller 122.

That is, the I-Q signal generator 123 generates the I-Q signal having a 50% duty cycle by performing an OR combination on the I and Q signals.

The determination unit 130 receives the I-Q signal generated by the I-Q signal generator 123 of the signal control unit 120. Furthermore, the determination unit 130 determines whether the timing of the I signal matches that of the Q signal by analyzing the I-Q signal. If, as a result of the determination, the timing of the I signal does not match that of the Q signal, the determination unit 130 generates an I control signal and a Q control signal.

The I control signal controls the timing of the I signal by controlling the I signal controller 121, while the Q control signal controls the timing of the Q signal by controlling the Q signal controller 122.

In this case, the determination unit 130 may determine whether the timing of the I signal matches that of the Q signal by comparing and analyzing the I signal whose timing has been corrected by the I signal controller 121 and the Q signal whose timing has been corrected by the Q signal controller 122.

Furthermore, the determination unit 130 receives the OR output signal and the AND output signal generated by the I-Q signal control unit 140, and determines whether the OR output signal matches the AND output signal by comparing the OR output signal with the AND output signal. If the OR output signal does not match the AND output signal, the determination unit 130 generates the I-Q control signal, and controls the timing of the I-Q signal by controlling the I-Q signal controller 141 of the I-Q signal control unit 140 using the generated I-Q control signal. In this case, the determination unit 130 may control the I-Q signal controller 141 until the OR output signal and the AND output signal output from the I-Q signal control unit 140 match each other.

The I-Q signal control unit 140 may include an I-Q signal controller 141, a signal combiner 142, and a comparator 143.

The I-Q signal controller 141 controls the timing of the I-Q signal using the I-Q control signal generated by the determination unit 130.

The signal combiner 142 generates the OR output signal by performing an OR combination of the 50% duty signal, received from the I-Q signal control unit 140, and the I-Q signal whose timing has been controlled by the I-Q signal controller 141.

The comparator 143 generates the AND output signal by performing an AND combination of the 50% duty signal, input to the I-Q signal control unit 140, and the I-Q signal whose timing has been controlled by the I-Q signal controller 141.

The signal output unit 150 performs control so that the I and Q signals are output when the timing of the I signal matches that of the Q signal, i.e., only when the timing of the falling edge of the I signal matches that of the rising edge of the Q signal as shown in FIG. 10.

For this purpose, the signal output unit 150 controls signal controllers based on the I-Q control signal of the determination unit 130 so that the I and Q signals are output.

Figure 5:
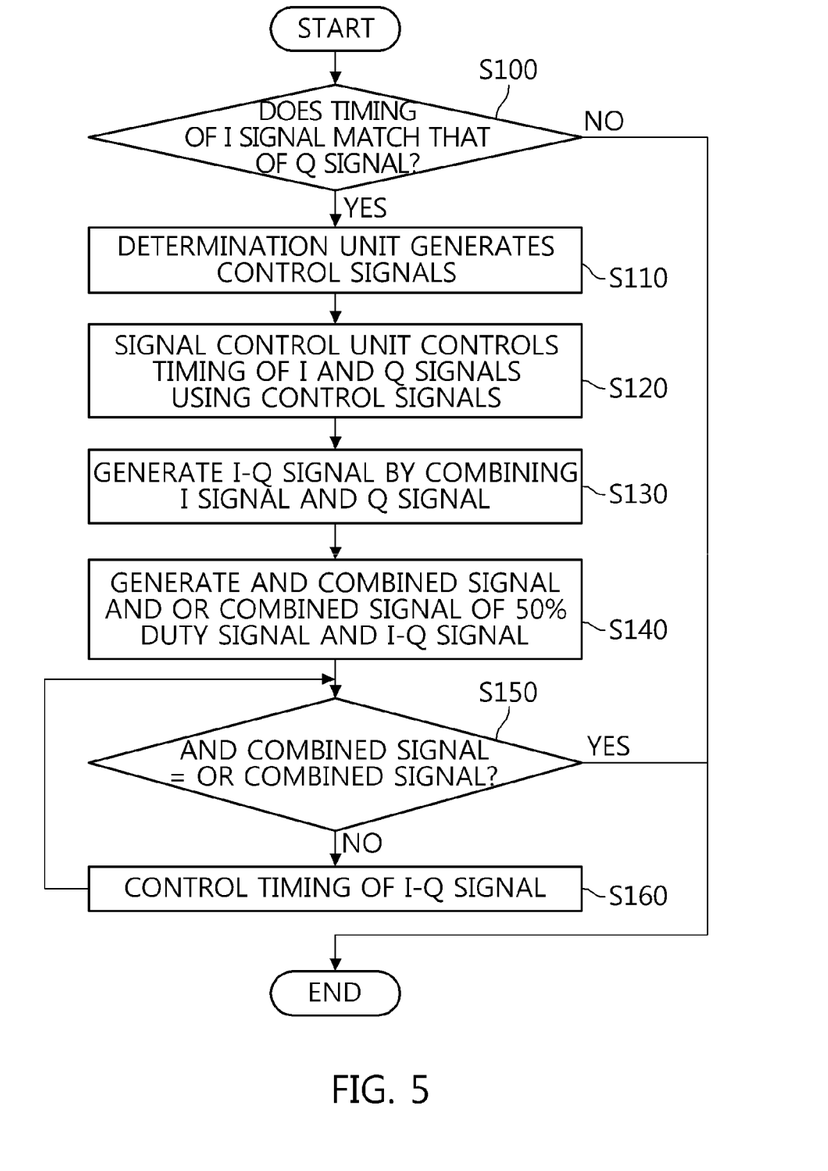
FIG. 5 is a flowchart illustrating a method of compensating for the duty signals of an I signal and a Q signal according to an embodiment of the present invention.

FIG. 5 is a flowchart illustrating a method of compensating for the duty signals of an I signal and a Q signal according to an embodiment of the present invention.

At step S100, the determination unit 130 determines whether the timing of an I signal input to the signal input unit 110 matches that of a Q signal input to the signal input unit 110.

The determination unit 130 receives the I and Q signals whose timing has been controlled by the signal input unit 110, and determines whether the timing of the I signal matches that of the Q signal by comparing the timing of the I signal with that of the Q signal.

In this case, as described above, the determination unit 130 may determine whether the timing of the I signal matches that of the Q signal by analyzing an I-Q signal generated by the signal combiner 123 of the signal control unit 120.

At step S110, the determination unit 130 generates a control signal adapted to control the timing of each of the I and Q signals if, as a result of the determination at step S100, the timing of the I signal does not match that of the Q signal.

If the timing of the I signal does not match that of the Q signal, the determination unit 130 generates an I control signal adapted to control the timing of the I signal and a Q control signal adapted to control the timing of the Q signal.

At step S120, the signal control unit 120 controls the timing of the I signal and the timing of the Q signal using the I control signal and the Q control signal.

As described above, the signal control unit 120 functions to match the timing of the I signal with the timing of the Q signal using the control signals generated by the determination unit 130.

At step S130, the signal control unit 120 generates an I-Q signal by combining the I and Q signals.

At step S140, the I-Q signal control unit 140 generates an OR output signal, i.e., an OR combination of a 50% duty signal and the I-Q signal, and an AND output signal, i.e., an AND combination of the 50% duty signal and the I-Q signal, using the received 50% duty signal and the I-Q signal received from the signal control unit 120.

Figure 11:
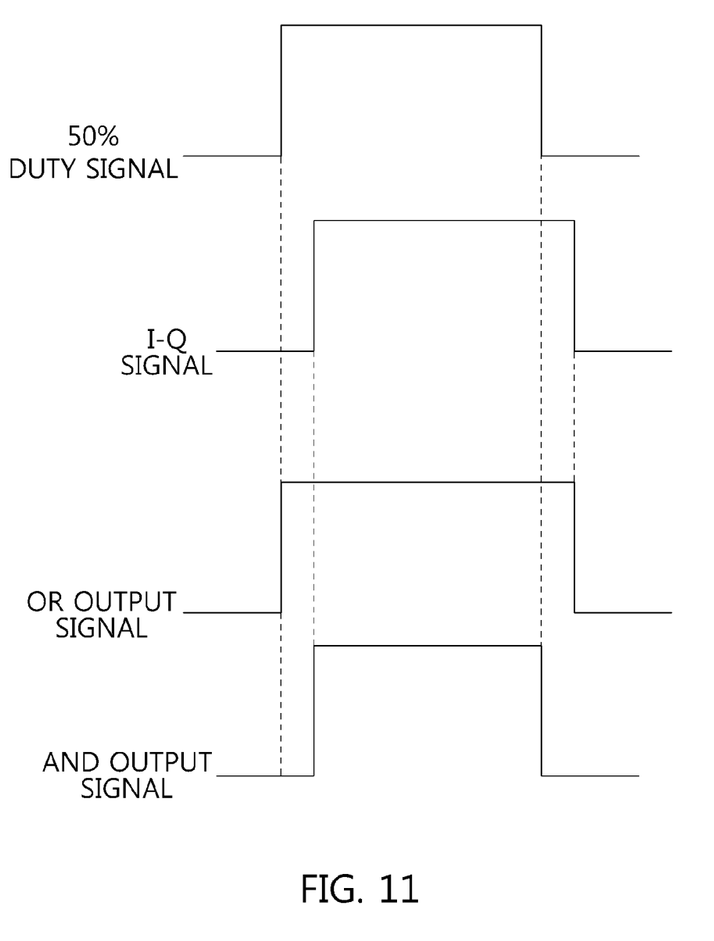
FIG. 11 is a diagram illustrating that a point of time at which an I signal is generated is corrected using an OR output signal and an AND output signal according to an embodiment of the present invention.

A method of generating the OR output signal, i.e., an OR combination of the 50% duty signal and the I-Q signal, and the AND output signal, i.e., an AND combination of the 50% duty signal and the I-Q signal, has been shown in FIG. 11.

At step S150, the determination unit 130 determines whether the OR output signal matches the AND output signal.

If the OR output signal matches the AND output signal, the I signal and Q signal whose timing has been corrected are output via the signal output unit 150 because the timing of the I signal has matched that of the Q signal according to an object of the present invention (i.e., as in the case of FIG. 7).

At step S160, if the OR output signal does not match the AND output signal, the determination unit 130 generates an I-Q control signal, and controls the timing of the I-Q signal until the OR output signal matches the AND output signal.

FIG. 11 is a diagram illustrating that a point of time at which an I signal is generated is corrected using an OR output signal and an AND output signal according to an embodiment of the present invention.

If the timing of an I signal does not match that of a Q signal, the start point of the signal also does not match a clock.

In an embodiment of the present invention, assuming that the start point of a signal is the rising edge of an I signal, if an I-Q signal in which the I signal generated by the signal control unit 120 has priority is generated and an OR output signal and AND output signal generated by combining the I-Q signal and a 50% duty signal are made to match each other as described above, the timing of the rising edge of the I signal, i.e., the start point of the I signal, matches the timing of the rising edge of the 50% duty signal.

Accordingly, the rising edge of the I signal, i.e., the start point of the signal, may be made to match a clock (i.e., a 50% duty signal).

As described above, the present invention is advantageous in that it can mitigate a crosstalk phenomenon in a wireless transmission and reception system by compensating for a timing error between an I signal and a Q signal and a point of time at which the I signal is generated, and also can help to improve the linearity of a wireless transmission system.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. An apparatus for compensating for duty signals, comprising:
    a signal input unit configured to receive a first signal and a second signal;
    a signal control unit configured to control timing of each of the first signal and the second signal based on each of a first control signal and a second control signal, and to output a combined signal in which the first signal and second signal whose timing has been controlled are combined;
    a combined signal control unit configured to output a first logic operation signal and a second logic operation signal by performing logic operation processing on a duty signal and the combined signal;
    a determination unit configured to determine whether the timing of the first signal matches the timing of the second signal, to generate the first control signal and the second control signal if the timing of the first signal does not match the timing of the second signal, to output the generated first control signal and second control signal, and to apply a third control signal, adapted to control timing of the combined signal, to the combined signal control unit; and
    a signal output unit configured to output the first signal and the second signal whose timing has been matched by the signal control unit,
    wherein:
    the first logic operation signal is an OR output signal generated by performing an OR operation of the combined signal and the duty signal; and
    the second logic operation signal is an AND output signal generated by performing an AND operation of the combined signal and the duty signal.

2. The apparatus of claim 1, wherein:
    the first signal is an I signal; and
    the second signal is a Q signal.

3. The apparatus of claim 2, wherein the I and Q signals have a 25% duty cycle.

4. The apparatus of claim 1, wherein:
    the first control signal is a signal adapted to control the timing of the first signal; and
    the second control signal is a signal adapted to control the timing of the second signal.

5. The apparatus of claim 1, wherein the combined signal control unit comprises:
    a signal combiner configured to generate the OR output signal;
    a comparator configured to generate the AND output signal; and
    a combined signal controller configured to control the timing of the combined signal based on the third control signal.

6. The apparatus of claim 1, wherein the determination unit applies the third control signal to the combined signal controller until the AND output signal matches the OR output signal.

7. The apparatus of claim 1, wherein the combined signal is configured such that a falling edge of the first signal matches a rising edge of the second signal.

8. A method of compensating for a duty signal, comprising:

determining, by a determination unit, whether timing of a first signal input to a signal input unit matches timing of a second signal input to the signal input unit;

generating, by the determination unit, a control signal;

outputting, by a signal control unit, a combined signal by combining the first signal and the second signal;

outputting, by a combined signal control unit, a first logic operation signal and a second logic operation signal by performing logic operation processing on a duty signal and the combined signal; and     outputting, by a signal output unit, the first signal and second signal whose timing has been matched,     wherein determining whether the timing of the first signal matches the timing of the second signal comprises determining whether timing of a falling edge of the first signal matches timing of a rising edge of the second signal.

9. The method of claim 8, wherein:
    the first signal is an I signal; and
    the second signal is a Q signal.

10. The method of claim 8, wherein the control signal comprises:
    a first control signal adapted to control the timing of the first signal;
    a second control signal adapted to control the timing of the second signal; and
    a third control signal adapted to control timing of the combined signal.

11. The method of claim 8, wherein the controlled first signal and the controlled second signal have a 25% duty cycle in which the timing of the falling edge of the first signal matches the timing of the rising edge of the second signal.

12. The method of claim 8, wherein:
    the first logic operation signal comprises an OR output signal generated by performing an OR operation of the combined signal and the duty signal; and
    the second logic operation signal comprises an AND output signal generated by performing an AND operation of the combined signal and the duty signal.

\* \* \* \* \*